(12) United States Patent
Hu et al.

(10) Patent No.: US 11,560,330 B2
(45) Date of Patent: Jan. 24, 2023

(54) PATTERNED GLASS ARTICLES AND METHODS OF MAKING THE SAME

(71) Applicant: CORNING INCORPORATED, Corning, NY (US)

(72) Inventors: Hongmei Hu, Painted Post, NY (US); Yuhui Jin, Painted Post, NY (US); Richard Alan Quinn, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 213 days.

(21) Appl. No.: 16/767,992

(22) PCT Filed: Nov. 29, 2018

(86) PCT No.: PCT/US2018/063096
§ 371 (c)(1),
(2) Date: May 28, 2020

(87) PCT Pub. No.: WO2019/108816
PCT Pub. Date: Jun. 6, 2019

(65) Prior Publication Data
US 2021/0188698 A1  Jun. 24, 2021

Related U.S. Application Data

(60) Provisional application No. 62/592,477, filed on Nov. 30, 2017.

(51) Int. Cl.
*B32B 3/00* (2006.01)
*C03C 4/18* (2006.01)
(Continued)

(52) U.S. Cl.
CPC ............... *C03C 4/18* (2013.01); *C03C 3/097* (2013.01); *C03C 21/002* (2013.01); *H05K 5/03* (2013.01); *C03C 2204/00* (2013.01)

(58) Field of Classification Search
CPC ............................... C03C 21/002; H05K 5/03
See application file for complete search history.

(56) References Cited

U.S. PATENT DOCUMENTS 8,598,771 B2  12/2013  Carlson et al.
9,573,842 B2   2/2017  Gollier et al.
(Continued)

FOREIGN PATENT DOCUMENTS

CN   102858705 A   1/2013
CN   102869629 A   1/2013
(Continued)

OTHER PUBLICATIONS

Chinese Patent Application No. 201880077847.6, Office Action dated Feb. 22, 2022, 14 pages (5 pages of English Translation and 9 pages of Original copy), Chinese Patent Office.
(Continued)

*Primary Examiner* — Elizabeth E Mulvaney
(74) *Attorney, Agent, or Firm* — John P. McGroarty

(57) ABSTRACT

A patterned article that includes: an alkali silicate glass substrate comprising a thickness and a primary surface, the substrate having a bulk composition; a patterned region defined by at least a portion of the primary surface; and a compressive stress region that extends from the at least a portion of the primary surface to a first depth within the substrate. The patterned region comprises a surface roughness (Ra) from about 1 nm to about 600 nm and at least one of a plurality of protrusions and a plurality of depressions. Further, each of the compressive stress region and the patterned region comprises a concentration of at least one alkali metal ion that is different than the concentration of the at least one alkali metal ion in the bulk composition.

20 Claims, 6 Drawing Sheets

(51) Int. Cl.
*C03C 3/097* (2006.01)
*C03C 21/00* (2006.01)
*H05K 5/03* (2006.01)

(56) References Cited

U.S. PATENT DOCUMENTS

| | | |
|---|---|---|
| 9,855,263 B2 | 1/2018 | Wening et al. |
| 10,183,889 B2 * | 1/2019 | Collier .................... C03C 15/00 |
| 10,239,782 B2 | 3/2019 | Bazemore et al. |
| 10,656,454 B2 | 5/2020 | Bazemore et al. |
| 2010/0246016 A1 | 9/2010 | Carlson et al. |
| 2011/0267698 A1 | 11/2011 | Guilfoyle et al. |
| 2012/0218640 A1 | 8/2012 | Gollier et al. |
| 2014/0255903 A1 | 9/2014 | Bookbinder et al. |
| 2015/0175478 A1 | 6/2015 | Ravichandran et al. |
| 2017/0285227 A1 | 10/2017 | Chen et al. |
| 2018/0215657 A1 | 8/2018 | Jin |
| 2018/0282201 A1 | 10/2018 | Hancock, Jr. et al. |
| 2020/0277224 A1 * | 9/2020 | Weber ................... C03C 21/003 |
| 2021/0080778 A1 * | 3/2021 | Hatano ................. C03C 21/002 |

FOREIGN PATENT DOCUMENTS

| | | |
|---|---|---|
| CN | 103534219 A | 1/2014 |
| CN | 107076878 A | 8/2017 |
| EP | 2207756 A1 | 7/2010 |
| JP | 05998030 B2 | 9/2016 |
| TW | 201300338 A | 1/2013 |
| TW | 201621351 A | 6/2016 |
| WO | 2011/137141 A1 | 11/2011 |
| WO | 2016/069113 A1 | 5/2016 |
| WO | 2018/140581 A1 | 8/2018 |
| WO | 2018/182996 A1 | 10/2018 |

OTHER PUBLICATIONS

International Search Report and Written Opinion of the International Searching Authority; PCT/US2018/063096; dated Mar. 13, 2019; 12 Pages; European Patent Office.

Kimmel; "Review Paper: Diffractive Backlight Technologies for Mobile Applications"; J. of the SID. 2012, 245 258.

Skedung et al.; "Feeling Small: Exploring the Tactile Perception Limits"; Scientific Reports. 2013, 2617; 6 Pages.

Taiwanese Patent Application No. 107142930, Office Action dated Sep. 13, 2022, 4 pages (English Translation Only); Taiwanese Patent Office.

* cited by examiner

PATTERNED GLASS ARTICLES AND METHODS OF MAKING THE SAME

CROSS-REFERENCE TO RELATED APPLICATIONS

This application is a national stage entry of International Patent Application Serial No. PCT/US2018/063096 filed on Nov. 29, 2018, which claims the benefit of priority under 35 U.S.C. § 119 of U.S. Provisional Application Ser. No. 62/592,477 filed on Nov. 30, 2017, the content of which is relied upon and incorporated herein by reference in its entirety.

FIELD

The present disclosure generally relates to patterned articles and methods of making the same, particularly patterned glass articles fabricated with a differential ion-exchange process.

BACKGROUND

Antiglare surfaces are often used in display devices such as LCD screens, OLEDs and touch screens to avoid or reduce specular reflection of ambient light. In many display devices, these antiglare surfaces are formed by providing a level of roughness to one or more surfaces of the glass to spread and scatter incident light. Antiglare surfaces in the form a roughened glass surface are often used on the front surfaces of these display devices to reduce the apparent visibility of external reflections from the display and improve readability of the display under differing lighting conditions. These roughened surfaces are also employed in some display device applications, particularly touch screens, to improve tactile feeling.

Display "sparkle" or "dazzle" is a phenomenon that can occur when antiglare or light scattering surfaces are incorporated into a display system. Sparkle is associated with a very fine grainy appearance that can appear to have a shift in the pattern of the grains with changing viewing angle of the display. This type of sparkle is observed when pixelated displays, such as LCDs, are viewed through an antiglare surface. As the resolution of display devices continues to increase, particularly for handheld electronic devices, the pixel pitch of the array of pixels employed in these devices continues to decrease, exacerbating unwanted sparkle effects.

Conventional approaches to making patterned glass surfaces suffer from the use of treatments that employ aggressive acids, such as hydrofluoric acid, that are not considered environmentally friendly and costly to employ in manufacturing. Still further, conventional approaches to patterning and texturing glass for roughened antiglare surfaces result in relatively large features which can limit the effectiveness of these surfaces in minimizing sparkle. Further, other conventional approaches to creating antiglare surfaces employ additional coatings which can increase manufacturing cost and produce unwanted optical effects.

In view of these considerations, there is a need for patterned articles with smaller features and methods of making the same, particularly hydrofluoric acid-free methods to produce substantially transparent, low sparkle, patterned glass articles.

SUMMARY

In a first aspect, an article comprises an alkali silicate glass substrate comprising a thickness and a primary surface, the substrate having a bulk composition; a patterned region defined by at least a portion of the primary surface; and a compressive stress region that extends from the at least a portion of the primary surface to a first depth within the substrate, wherein the patterned region comprises a surface roughness ($R_a$) from about 1 nanometer (nm) to about 600 nm and at least one of a plurality of protrusions and a plurality of depressions, and further wherein each of the compressive stress region and the patterned region comprises a concentration of at least one alkali metal ion that is different than the concentration of the at least one alkali metal ion in the bulk composition.

A second aspect according to the first aspect, wherein the patterned region comprises a surface roughness ($R_a$) from about 1 nm) to about 100 nm.

A third aspect according to the first or second aspect, wherein the patterned region further comprises a maximum valley depth ($R_{pv}$) from about 10 nm to about 750 nm.

A fourth aspect according to any preceding aspect, wherein the patterned region further comprises a maximum valley depth ($R_{pv}$) from about 10 nm to about 250 nm.

A fifth aspect according to any preceding aspect, wherein the patterned region comprises a plurality of protrusions and a plurality of depressions, and further wherein the plurality of protrusions comprises a maximum protrusion compressive stress and the plurality of depressions comprises a maximum depression compressive stress, the maximum protrusion and depression compressive stresses differing from one another.

A sixth aspect according to any preceding aspect, further comprising: a non-patterned region defined by a second portion of the primary surface, wherein the compressive stress region comprises a compressive stress that is greater in magnitude than any residual stress in the non-patterned region.

In a seventh aspect, an article, comprises: an alkali silicate glass substrate comprising a thickness and a primary surface, the substrate having a bulk composition; a patterned region defined by at least a portion of the primary surface and comprising at least one of a plurality of protrusions and a plurality of depressions; and a compressive stress region that extends from the at least a portion of the primary surface to a first depth within the substrate, wherein the patterned region comprises a surface roughness ($R_a$) from about 1 nm to about 600 nm, and further wherein the patterned region comprises a concentration of at least one alkali metal ion that is different than the concentration of the at least one alkali metal ion in the bulk composition.

An eighth aspect according to the seventh aspect, wherein the patterned region comprises a surface roughness ($R_a$) from about 1 nm to about 100 nm.

A ninth aspect according to the seventh or eighth aspect, wherein the patterned region further comprises a maximum valley depth ($R_{pv}$) from about 10 nm to about 750 nm.

A tenth aspect according to any one of the seventh through ninth aspects, wherein the patterned region further comprises a maximum valley depth ($R_{pv}$) from about 10 nm to about 250 nm.

An eleventh aspect according to any one of the seventh through tenth aspects, wherein the patterned region comprises a plurality of protrusions and a plurality of depressions, and further wherein the plurality of protrusions comprises a maximum protrusion compressive stress and the plurality of depressions comprises a maximum depression compressive stress, the maximum protrusion and depression compressive stresses differing from one another.

A twelfth aspect according to any one of the seventh through eleventh aspects, wherein the compressive stress region and the patterned region are formed by an ion-exchange process.

In a thirteenth aspect, an electronic device, comprises: a housing having a front surface, a back surface and side surfaces; electrical components provided at least partially within the housing, the electrical components including at least a controller, a memory, and display, the display being provided at or adjacent the front surface of the housing; and a cover substrate, wherein at least a portion of at least one of the cover substrate and the housing comprises the article of any preceding aspect.

In a fourteenth aspect, a method of making a patterned article, comprises: disposing a plurality of masks comprising a multivalent metal salt on a primary surface of an alkali silicate glass substrate to form a masked substrate; and subjecting the masked substrate to an ion exchange process to form a compressive stress region and a patterned region in the masked substrate, wherein the patterned region comprises a surface roughness ($R_a$) from about 1 nm to about 600 nm and at least one of a plurality of protrusions and a plurality of depressions, and further wherein the patterned region comprises a concentration of at least one alkali metal ion that is different than the concentration of the at least one alkali metal ion in a bulk composition of the substrate.

A fifteenth aspect according to the fourteenth aspect, further comprising: removing the plurality of masks comprising a multivalent metal salt on the primary surface of the alkali silicate glass substrate, the removing being conducted after subjecting the masked substrate to the ion exchange process.

A sixteenth aspect according to the fourteenth or fifteenth aspect, wherein the multivalent metal salt is selected from the group consisting of calcium chloride, calcium nitrate, barium chloride, barium nitrate, magnesium chloride, magnesium nitrate, zinc chloride, zinc nitrate, zinc sulfate, strontium chloride and strontium nitrate.

A seventeenth aspect according to the fourteenth or fifteenth aspect, wherein the multivalent metal salt is capable of providing at least one of sodium, potassium, rubidium, cesium, silver and copper (I) ions.

An eighteenth aspect according to any one of the fourteenth through seventeenth aspects, further comprising: subjecting the alkali silicate glass substrate to an ion exchange process to form an initial compressive stress region in the alkali silicate glass substrate prior to disposing the plurality of masks.

A nineteenth aspect according to any one of the fourteenth through eighteenth aspects, wherein the patterned region is defined by at least a portion of the primary surface and the compressive stress region extends from the at least a portion of the primary surface to a first selected depth within the substrate.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the above-described aspects.

BRIEF DESCRIPTION OF THE DRAWINGS

These and other features, aspects and advantages of the present disclosure are better understood when the following detailed description of the disclosure is read with reference to the accompanying drawings, in which.

DETAILED DESCRIPTION

Figure 1:
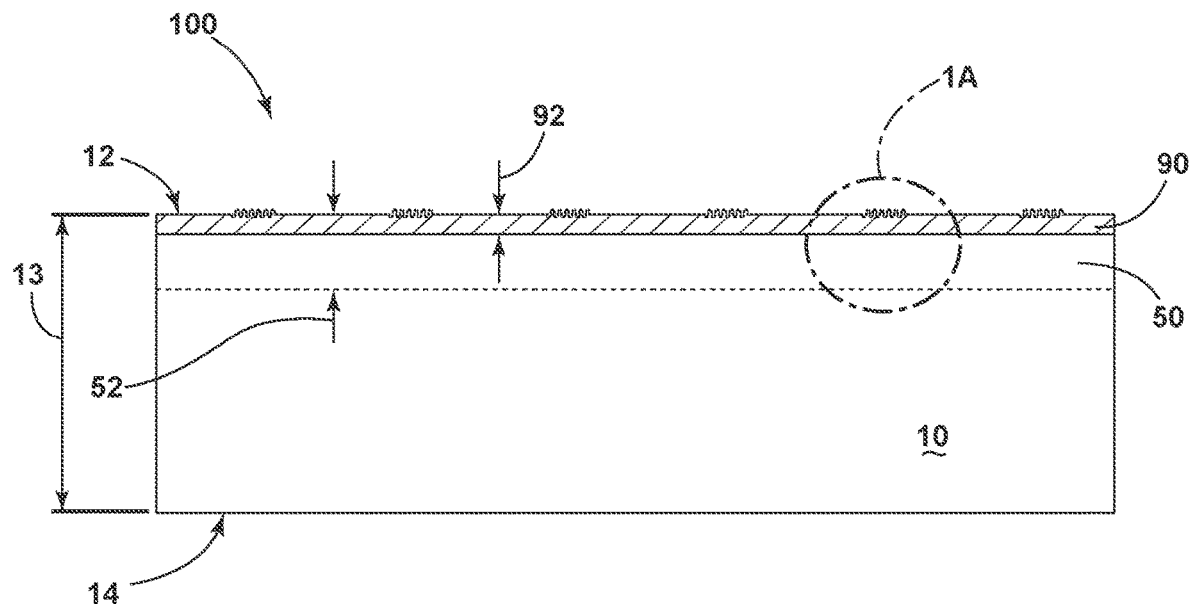
FIG. 1 is a cross-sectional, schematic view of a patterned article comprising a patterned region and a compressive stress region, according to an aspect of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

Aspects of the disclosure generally pertain to patterned articles and methods of making the same. Aspects of the disclosure include methods of making these articles, particularly with hydrofluoric acid-free processes and differential ion exchange (d-IOX) process steps. More generally, the approaches to preparing the patterned articles of the disclosure generate finely textured glass surfaces having patterned regions with small features, e.g., an average feature size from about 1 microns to about 100 microns and/or a surface roughness ($R_a$) from about 1 nm to about 600 nm. Further, the processes of the disclosure can produce patterned regions in glass surfaces comprising a plurality of protrusions and/or a plurality of depressions. Further, the d-IOX process steps of the disclosure can produce different compositions and/or residual stress states within the patterned regions of these glass surfaces, and as compared to other portions of these surfaces.

Figure 1A:
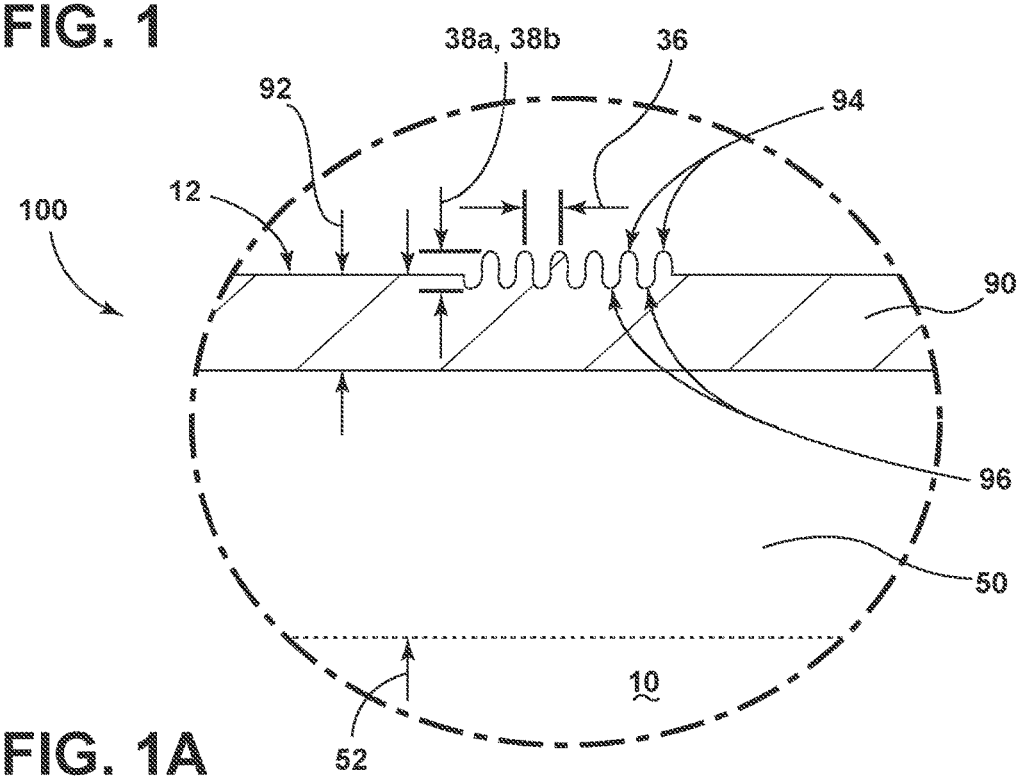
FIG. 1A is an enlarged view of a portion of the patterned article depicted in FIG. 1, including its patterned and compressive stress regions.

Referring to FIGS. 1 and 1A, a patterned article 100 is depicted as including an alkali silicate glass substrate 10 (e.g., a glass containing alkali metal ions and silica) with primary surfaces 12 and 14, a thickness 13 and a bulk composition comprising silica and one or more alkali metal ions. The patterned article 100 also includes a patterned region 90 with a thickness 92, as defined by at least a portion of the primary surface 12, at least a portion of primary surface 14 (not shown) and/or at least a portion of both primary surfaces 12, 14 (not shown). That is, the patterned region 90 can be defined by the entirety or portions of one or both of the primary surfaces 12, 14. Further, the patterned article 100 includes a compressive stress region 50 that extends from at least a portion of the primary surface 12 to a first selected depth 52, at least a portion of primary surface 14 to a selected depth (not shown) and/or at least a portion of both primary surfaces 12, 14 to selected depths (not shown). In some embodiments of the article 100, a non-patterned region (not shown) can be defined by any portions of the primary surfaces 12, 14 not defining the patterned region 90, wherein the compressive stress region 50 comprises a compressive stress (e.g., a residual compressive stress) that is different in magnitude than any residual stress present in the non-patterned region.

Figure 1B:
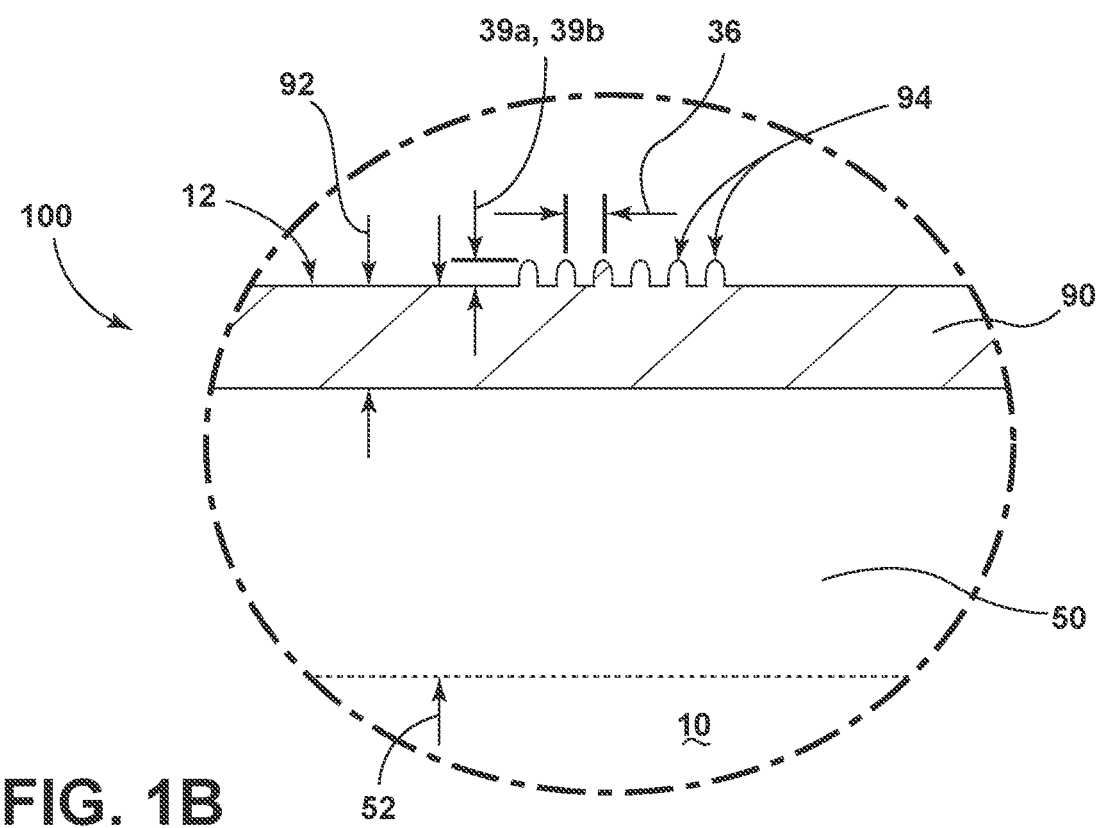
FIG. 1B is a plan view of a portion of a patterned article similar to the patterned article depicted in FIG. 1, with a patterned region comprising only a plurality of protrusions.

Referring again to FIGS. 1 and 1A, the patterned article 100 can be configured such that its compressive stress region 50 and patterned region 90 include a plurality of ion-exchanged, alkali metal ions. For example, the bulk composition of the glass substrate 10 can include a plurality of sodium ions and the compressive stress region 50 and patterned region 90 can include a plurality of ion-exchanged potassium ions, among other alkali metal ions, including sodium ions. Thus in some embodiments, the compressive stress region 50 and the patterned region 90 comprise, a concentration of at least one alkali metal ion that is different than the concentration of the at least one alkali metal ion in the bulk composition as a result of the ion exchange. In other implementations, the patterned article 100 can be configured such that its patterned region 90 comprises a plurality of protrusions 94 (see FIG. 1B), a plurality of depressions 96 (see FIG. 1C), or a combination of protrusions 94 and depressions 96 (see FIG. 1A). Further, each of the plurality of protrusions 94 and the plurality of depressions 96 can possess a composition comprising silica and a plurality of alkali metal ions that differs from the bulk composition of the glass substrate 10. Hence, the local composition of the plurality of the protrusions 94 and plurality of depressions 96 can be configured to differ from the surrounding composition in the bulk of the glass substrate 10 as a result of ion exchange. In some embodiments of the patterned article 100 comprising a plurality of protrusions 94 and a plurality of depressions 96, the compositions of these pluralities can differ from one another, and also from the bulk composition of the glass substrate 10.

Figure 1C:
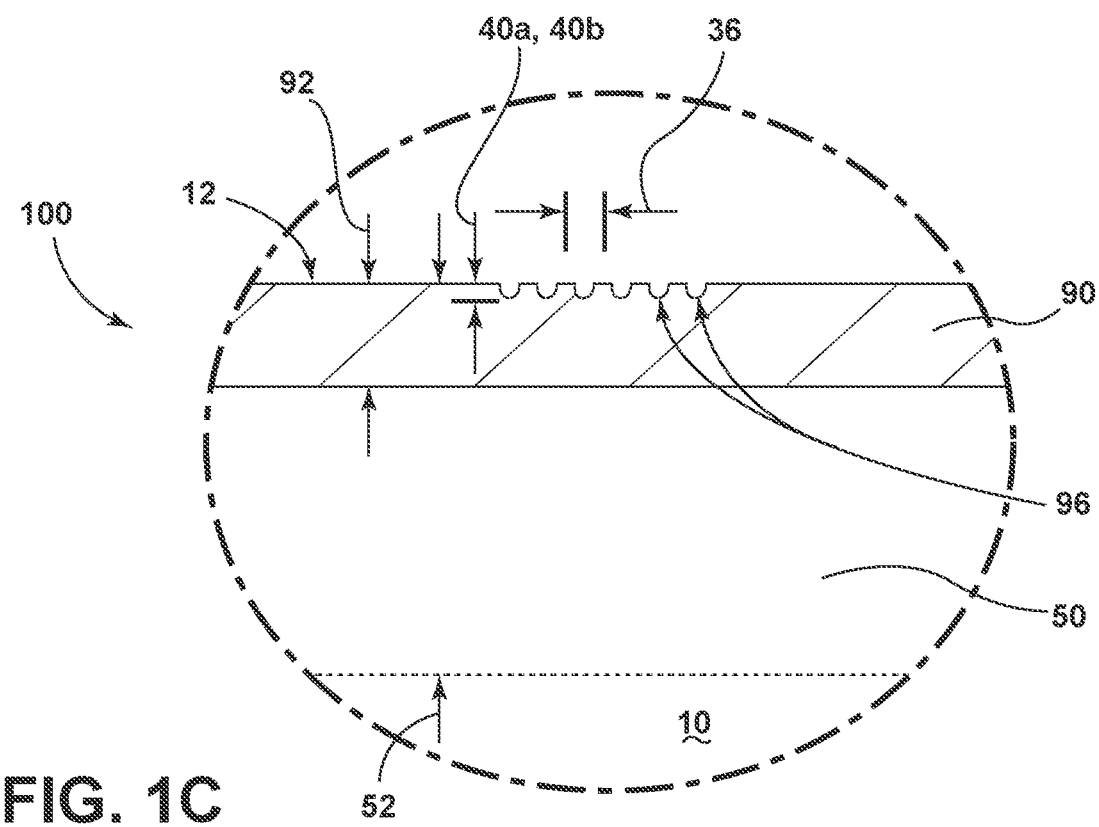
FIG. 1C is plan view of a portion of a patterned article similar to the patterned article depicted in FIG. 1, with a patterned region comprising only a plurality of depressions.

As generally depicted in FIGS. 1-1C, the patterned region 90 of the patterned article 100 includes a plurality of features, e.g., protrusions 94 and/or depressions 96, with an average feature size 36. These features also include a surface roughness ($R_a$) 38a and maximum valley depth ($R_{pv}$) 38b for patterned regions 90 with a combination of protrusions 94 and depressions 96; surface roughness ($R_a$) 39a and maximum valley depth ($R_{pv}$) 39b for patterned regions 90 with only protrusions 94; and surface roughness ($R_a$) 40a and maximum valley depth ($R_{pv}$) 40b for patterned regions 90 with depressions 96. According to some implementations of the patterned article 100, the patterned region 90 is configured to reduce the level of glare associated with the article when it is employed in a display device. The average feature size 36 is given by an average of the maximum dimension in the xy plane of a sampling of features associated with the patterned region 90, measured according to analytical techniques as understood by those with ordinary skill in the field of this disclosure, for example, by taking a photomicrograph of primary surface 12 at 200× magnification and measuring the maximum dimension of a sampling of at least ten (10) features. Accordingly, the terms "average feature size" and "average maximum dimension" are used interchangeably in the disclosure. In some embodiments at least some of the features of the patterned region 90 have a peak (also referred to as a protrusion) and/or a valley (also referred to as a depression), as manifested by a plurality of protrusions 94 and a plurality of depressions 96. The "maximum dimension" of the features is the greatest distance from one portion of a peak of a feature to another portion of the peak of the feature or the greatest distance from one portion of a valley of a feature to another portion of the valley of the feature. In embodiments, the average feature size 36 associated with the patterned region 90 of the article 100 is less than or equal to about 100 microns. According to some implementations, the average feature size 36 associated with the patterned region 90 is less than or equal to about 100 microns, such as less than or equal to about 75 microns, less than or equal to about 50 microns, less than or equal to about 25 microns, less than or equal to about 10 microns, less than or equal to about 9 microns, less than or equal to about 8 microns, less than or equal to about 7 microns, less than or equal to about 6 microns, less than or equal to about 5 microns, less than or equal to about 4 microns, less than or equal to about 3 microns, less than or equal to about 2 microns, less than or equal to about 1 micron, and all values between or below these upper limits.

Referring again to the patterned region 90 associated with the patterned article 100 depicted in FIGS. 1 and 1A, the average surface roughness ($R_a$) 38a and maximum valley depth ($R_{pv}$) 38b can be measured using an interferometer and a sample area of 200 microns by 200 microns, according to conventional methods understood by those with ordinary skill in the field of the disclosure associated with surface roughness ($R_a$) and maximum valley depth ($R_{pv}$) determinations. Unless otherwise noted, the interferometer used for the average surface roughness 38a and maximum valley depth 38b values reported in the disclosure is a ZYGO® NEWVIEW™ 7300 Optical Surface Profiler manufactured by ZYGO® Corporation. The surface roughness is reported as a mean surface roughness. In embodiments, the textured article 100 can employ a patterned region 90 having an average surface roughness ($R_a$) 38a from about 1 nanometer (nm) to about 600 nm. According to some implementations, the average roughness 38a ($R_a$) associated with the patterned region 90 is from about 1 nm to about 600 nm, such as from about 1 nm to about 500 nm, from about 1 nm to about 400 nm, from about 1 nm to about 300 nm, from about 1 nm to about 200 nm, from about 1 nm to about 100 nm, and values between these levels of surface roughness. In other implementations, the textured article 100 can employ a patterned region 90 having a maximum valley depth ($R_{pv}$) from about 10 nm to about 750 nm, such as from about 10 nm to about 500 nm, from about 10 nm to about 250 nm, and all maximum valley depth values between these levels.

When a patterned region 90 of a textured article 100 (see FIGS. 1 and 1A) has a relatively low spatial frequency, the roughness associated with its exposed features can begin to act like a plurality of lenses that generates an image artifact called "sparkle". Display "sparkle" or "dazzle" is a generally undesirable side effect that can occur when introducing antiglare or light scattering surfaces into a pixelated display system such as, for example, an LCD, an OLED, touch screens, or the like, and differs in type and origin from the type of "sparkle" or "speckle" that has been observed and characterized in projection or laser systems. Sparkle is associated with a very fine grainy appearance of the display, and may appear to have a shift in the pattern of the grains with changing viewing angle of the display. Display sparkle may be manifested as bright and dark or colored spots at approximately the pixel-level size scale.

As used herein, the terms "pixel power deviation" and "PPD" refer to the quantitative measurement for display sparkle. Further, as used herein, the term "sparkle" is used interchangeably with "pixel power deviation" and "PPD." PPD is calculated by image analysis of display pixels according to the following procedure. A grid box is drawn around each LCD pixel. The total power within each grid box is then calculated from CCD camera data and assigned as the total power for each pixel. The total power for each LCD pixel thus becomes an array of numbers, for which the mean and standard deviation may be calculated. The PPD value is defined as the standard deviation of total power per pixel divided by the mean power per pixel (times 100). The total power collected from each LCD pixel by the eye simulator camera is measured and the standard deviation of total pixel power (PPD) is calculated across the measurement area, which typically comprises about 30×30 LCD pixels.

The details of a measurement system and image processing calculation that are used to obtain PPD values are described in U.S. Pat. No. 9,411,180 entitled "Apparatus and Method for Determining Sparkle," the contents of which that is related to PPD measurements is incorporated by reference herein in its entirety. The PPD measurement system includes: a pixelated source comprising a plurality of pixels, wherein each of the plurality of pixels has referenced indices i and j; and an imaging system optically disposed along an optical path originating from the pixelated source. The imaging system comprises: an imaging device disposed along the optical path and having a pixelated sensitive area comprising a second plurality of pixels, wherein each of the second plurality of pixels are referenced with indices m and n; and a diaphragm disposed on the optical path between the pixelated source and the imaging device, wherein the diaphragm has an adjustable collection angle for an image originating in the pixelated source. The image processing calculation includes: acquiring a pixelated image of the transparent sample, the pixelated image comprising a plurality of pixels; determining boundaries between adjacent pixels in the pixelated image; integrating within the boundaries to obtain an integrated energy for each source pixel in the pixelated image; and calculating a standard deviation of the integrated energy for each source pixel, wherein the standard deviation is the power per pixel dispersion. As used herein, all "PPD" and "sparkle" values, attributes and limits are calculated and evaluated with a test setup employing a display device having a pixel density of 210 pixels per inch (PPI).

As generally depicted in FIGS. 1 and 1A, the patterned region 90 of the patterned article 100 can be configured to minimize sparkle. In some embodiments, the patterned region 90 is configured to minimize sparkle, while maintaining a reduced glare function suitable for display device applications. According to some embodiments, the patterned region 90 of the patterned article 100 is configured such that the article is characterized by a sparkle of 2% or less. In other aspects, the patterned articles 100 of the disclosure can be configured with a sparkle of 2% or less, such as 1.5% or less, 1% or less, 0.5% or less, and all sparkle levels between these upper limits.

Referring again to FIGS. 1 and 1A, the glass substrate 10 of the patterned article 100 can be configured with a multi-component glass composition, for example an alkali silicate glass having from about 40 mol % to 80 mol % silica, a plurality of alkali metal ions, and a balance of one or more other constituents, e.g., alumina, calcium oxide, boron oxide, etc. In some implementations, the bulk composition of the glass substrate 10 is selected from the group consisting of aluminosilicate glass, a borosilicate glass and a phosphosilicate glass. In other implementations, the bulk composition of the glass substrate 10 is selected from the group consisting of aluminosilicate glass, a borosilicate glass, a phosphosilicate glass, a soda lime glass, an alkali aluminosilicate glass, and an alkali aluminoborosilicate glass. In further implementations, the glass substrate 10 is a glass-based substrate, including but not limited to, glass-ceramic materials that comprise a glass (amorphous) component and a ceramic (crystallized) component. In implementations, the glass substrate 10 is a glass-based substrate, including but not limited to, glass-ceramic materials that comprise a glass (amorphous) component of about 90% or greater by weight and a ceramic (crystallized) component.

In one embodiment of the patterned article 100, the glass substrate 10 has a bulk composition that comprises an alkali aluminosilicate glass that comprises alumina, at least one alkali metal and, in some embodiments, greater than 50 mol % $SiO_2$, in other embodiments, at least 58 mol % $SiO_2$, and in still other embodiments, at least 60 mol % $SiO_2$, wherein the ratio ($Al_2O_3$ (mol %))+$B_2O_3$ (mol %))/Σ alkali metal oxides (mol %))>1. This glass, in particular embodiments, includes: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %)+$B_2O_3$ (mol %))/Σ alkali metal oxides (mol %)>1.

In another embodiment of the patterned article 100, as shown in FIGS. 1 and 1A, the glass substrate 10 has a bulk composition that comprises an alkali aluminosilicate glass including: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO.

In yet another embodiment, the glass substrate 10 has a bulk composition that comprises an alkali aluminosilicate glass including: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+Ca≤10 mol %.

In still another embodiment, the glass substrate 10 has a bulk composition that comprises an alkali aluminosilicate glass including: about 64 mol % to about 68 mol % $SiO_2$; about 12 mol % to about 16 mol % $Na_2O$; about 8 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2$+$B_2O_3$+CaO≤69 mol %; $Na_2O$+$K_2O$+$B_2O_3$+MgO+CaO+SrO>10 mol %; 5 mol %≤MgO+CaO+SrO≤8 mol %; ($Na_2O$+$B_2O_3$)—$Al_2O_3$≤2 mol %; 2 mol %≤$Na_2O$—$Al_2O_3$≤6 mol %; and 4 mol %≤($Na_2O$+$K_2O$)—$Al_2O_3$≤10 mol %.

In other embodiments, the glass substrate 10 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %))/$M_2O_3$ (mol %)]≤1.2, where $M_2O_3$=$Al_2O_3$+$B_2O_3$. In some embodiments, [($P_2O_5$ (mol %)+$R_2O$ (mol %))/$M_2O_3$ (mol %)]=1 and, in some embodiments, the glass does not include $B_2O_3$ and $M_2O_3$=$Al_2O_3$. The glass substrate 10 comprises, in some embodiments: about 40 to about 70 mol % $SiO_2$; 0 to about 28 mol % $B_2O_3$; about 0 to about 28 mol % $Al_2O_3$; about 1 to about 14 mol % $P_2O_5$; and about 12 to about 16 mol % $R_2O$. In some embodiments, the glass substrate 10 comprises: about 40 to about 64 mol % $SiO_2$; 0 to about 8 mol % $B_2O_3$; about 16 to about 28 mol % $Al_2O_3$; about 2 to about 12 mol % $P_2O_5$; and about 12 to about 16 mol % $R_2O$. The glass substrate 10 may further comprise at least one alkaline earth metal oxide such as, but not limited to, MgO or CaO.

In some embodiments, the glass substrate 10 has a bulk composition that is substantially free or free of lithium. As utilized herein, a glass substrate that is "substantially free" of a component is one in which the component is not actively added or batched into the glass substrate, but may be present in very small amounts as a contaminant. In embodiments, the glass comprises less than 1 mol % $Li_2O$, such as less than 0.1 mol % $Li_2O$, or less than 0.01 mol % $Li_2O$. In some embodiments, the glasses are substantially free or free of at least one of arsenic, antimony, and barium. In some embodiments, the glasses comprise less than 1 mol %, such as less than 0.1 mol %, of $As_2O_3$, $Sb_2O_3$, and/or BaO.

As used herein, the terms "transmission haze" and "haze" refer to the percentage of transmitted light scattered outside an angular cone of about ±2.5° in accordance with ASTM procedure D1003, entitled "Standard Test Method for Haze and Luminous Transmittance of Transparent Plastics," the contents of which is incorporated by reference herein in its entirety. For an optically smooth surface, transmission haze is generally close to zero. According to implementations of the patterned articles 100 (see FIGS. 1 & 1A), the articles can be characterized by a haze of 25% or less. In other implementations, for particular applications, patterned articles 100 consistent with the principles of this disclosure can be fabricated with haze levels as high as 100%, such as haze levels ranging from 0% to 100%, haze levels from 0% to 50%, and all haze levels between these values. For example, desired haze levels in a patterned article 100 can be obtained by controlling the conditions to develop the patterned region 90, as outlined below in connection with the methods of the disclosure.

According to embodiments, the glass substrate 10 of the patterned articles 100 (see FIGS. 1 & 1A) can possess an ion-exchangeable glass composition that is strengthened by either chemical or thermal means that are known in the art. In one embodiment, the glass substrate 10 is chemically strengthened by ion exchange. In this process, metal ions at or near primary surfaces 12 and/or 14 of the glass substrate 10 are exchanged for larger metal ions having the same valence as the metal ions in the glass substrate. The exchange is generally carried out by contacting the glass substrate 10 with an ion exchange medium such as, for example, a molten salt bath that contains the larger metal ion. The metal ions are typically monovalent metal ions such as, for example, alkali metal ions. In one non-limiting example, chemical strengthening of a glass substrate 10 that contains sodium ions by ion exchange is accomplished by immersing the glass substrate 10 in an ion exchange bath comprising a molten potassium salt, such as potassium nitrate ($KNO_3$) or the like. In one particular embodiment, the ions in the surface layer of the glass substrate 10 and the larger ions are monovalent alkali metal cations, such as $Li^+$ (when present in the glass), $Na^+$, $K^+$, $Rb^+$, and $Cs^+$. Alternatively, monovalent cations in the surface layer of the glass substrate 10 may be replaced with monovalent cations other than alkali metal cations, such as $Ag^+$ or the like.

In these embodiments, the replacement of small metal ions by larger metal ions in the ion exchange process creates a compressive stress region 50 in the glass substrate 10 of the patterned article 100 that extends from the primary surfaces 12 and/or 14 to a depth 52 (see FIGS. 1 & 1A) and/or other depths (not shown) (referred to as the "depth of layer") that is under compressive stress. This compressive stress at the primary surface of the glass substrate 10 is balanced by a tensile stress (also referred to as "central tension") within the interior of the glass substrate. In some embodiments, the primary surfaces 12, 14 of the glass substrate 10 described herein, when strengthened by ion exchange, have a compressive stress of at least 350 MPa, and the region under compressive stress extends to a depth 52, i.e., depth of layer, of at least 15 µm below the primary surfaces 12 and/or 14.

With further regard to the patterned articles 100 depicted in FIGS. 1 and 1A, the compressive stress region 50 can be formed prior to the development of the patterned region 90 or concurrently with the development of the patterned region 90. In the latter scenario, the compressive stress region 50 and the patterned region 90 can be formed at substantially the same time with a differential ion exchange process (d-IOX), as outlined below. In the former scenario, the compressive stress region 50 that is formed prior to the patterned region 90 is an initial compressive stress region, and subsequent processing, e.g., by a d-IOX process, completes the formation of the compressive stress region 50, along with the patterned region 90.

Ion exchange processes are typically carried out by subjecting the glass substrate 10 of the patterned article 100 to an ion exchange process, for example immersion in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a glass substrate 10 having an alkali aluminosilicate glass composition, result in a compressive stress region 50 having a depth 52 (depth of layer) greater than or equal to about 10 µm, such as ranging from about 10 µm up to about 200 µm, with a compressive stress ranging from about 200 MPa up to about 1000 MPa, and a central tension of less than about 100 MPa.

Figure 2A:
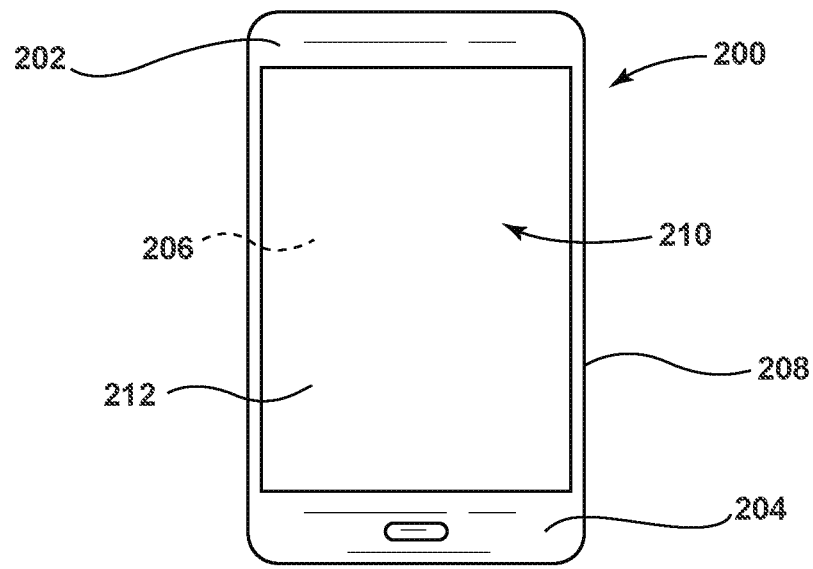
FIG. 2A is a plan view of an exemplary electronic device incorporating any of the patterned articles disclosed herein.
Figure 2B:
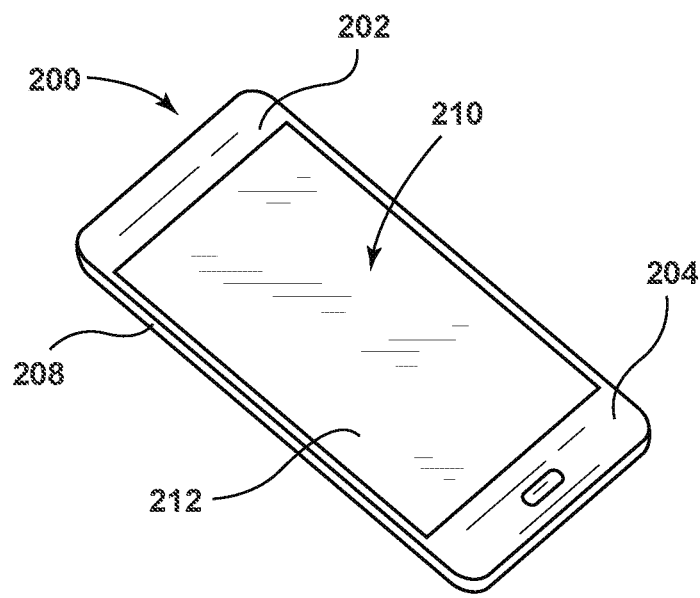
FIG. 2B is a perspective view of the exemplary electronic device of FIG. 2A.

The patterned articles 100 disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the patterned articles disclosed herein, including patterned articles 100 (see FIGS. 1 and 1A) is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least a portion of at least one of the cover substrate 212 and the housing 202 may include any of the glass articles disclosed herein.

Figure 3:
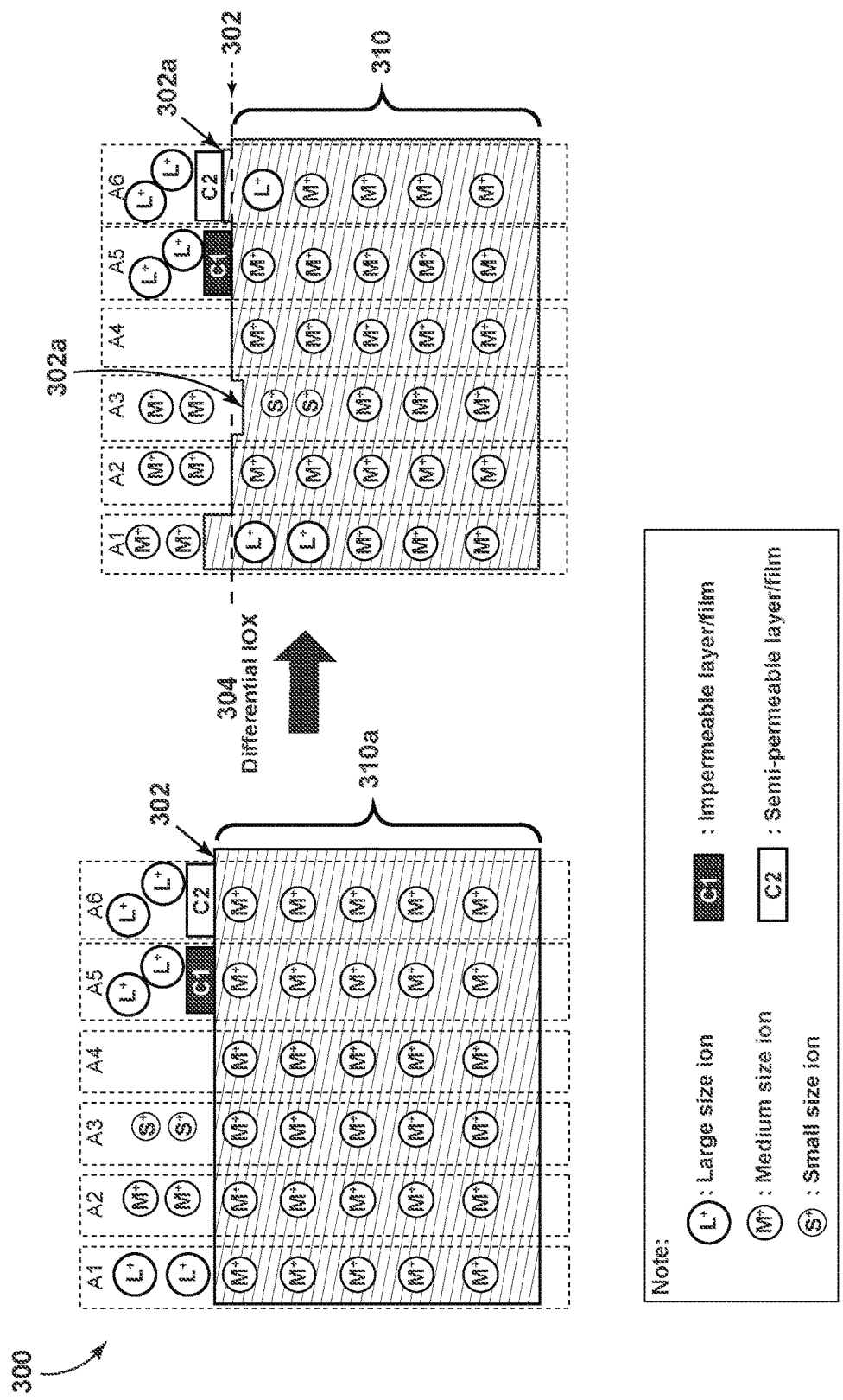
FIG. 3 is a schematic chart depicting a method of fabricating a textured article with various differential ion exchange processes, according to aspects of the disclosure.

Referring now to FIG. 3, a schematic chart is provided depicting a textured article 300, as fabricated with various differential ion exchange (d-IOX) processes, according to aspects of the disclosure. FIG. 3 depicts principles associated with d-IOX process steps of the disclosure, which can be employed to produce one or more patterned regions and compressive stress regions in the glass substrate 310 (e.g., patterned region 90 and/or compressive stress region 50 in the patterned article 100 shown in FIGS. 1 and 1A). In general, the d-IOX approach is a process step or steps (step 304 as shown in FIG. 3) of conducting an ion exchange reaction on a glass substrate in a different fashion at different locations on the primary surfaces of the substrate. In some aspects of the method, the d-IOX process 304 generates location-based stress differences and surface morphology changes to the primary surfaces 302 of the substrate 310a. As shown in FIG. 3, six scenarios (A1-A6) associated with the d-IOX process are depicted that involve treating a primary surface 302 of the glass substrate 310a with monovalent metal ions in an ion exchange step. Further, at least two of the scenarios (A1-A6) should be applied to the primary surface 302 of the glass substrate 310a as part of the d-IOX process to produce the glass substrate 310 with a patterned region.

Referring again to FIG. 3, in the A1 scenario, medium sized ions (M$^+$) present in the glass substrate are exchanged with larger size ions (L$^+$), for example Na$^+$ ions are exchanged with K$^+$ ions and/or Li$^+$ ions are exchanged with Na$^+$ ions. As noted in FIG. 3 the surface of the glass can grow in the thickness direction as a result of the A1 scenario after the d-IOX step 304, thus forming surface 302a. In the A2 scenario, medium size ions (M$^+$) in the glass substrate 310a are exchanged with medium size ions or similar size (M$^+$), for example Na$^+$ ions are exchanged with Na$^+$ ions. In some embodiments of the A2 scenario the surface of the glass can grow, contract, or stay the same in the thickness direction as a result of this ion exchange, thus forming surface 302a. In the A3 scenario, medium sized ions (M$^+$) present in the glass substrate are exchanged with smaller size ions (S*), for example K$^+$ ions are exchanged with Na$^+$ ions and/or Na$^+$ ions are exchanged with Li$^+$ ions. As noted in FIG. 3, the surface of the glass can contract or shrink in the thickness direction as result of the A3 scenario after the d-IOX step 304, thus forming surface 302a. Referring now to the A4 scenario, medium sized ions (M$^+$) present in the glass substrate are not exchanged as no other salts are placed in contact with the glass surface; consequently, the surface of the glass substrate does not experience a local change from this scenario. In the A5 scenario, the primary surface 302 is blocked by an impermeable layer or film (C1, solid block). As a result, the medium sized ions (M$^+$) present in the glass substrate are not exchanged with larger size ions (L$^+$) exposed to the surface 302, for example Na$^+$ ions in the glass are not exchanged with K$^+$ ions in the bath and/or Li$^+$ ions in the glass are not exchanged with Na$^+$ ions in the bath. Finally, with regard to the A6 scenario, the primary surface 302 is blocked by a semipermeable layer or film (C2, open block). As a result, the medium sized ions (M$^+$) present in the glass substrate are exchanged with larger size ions (L$^+$) exposed to the surface 302 at a slower rate than the exchange that occurs in the A1 scenario, for example Na$^+$ ions are exchanged with K$^+$ ions and/or Li$^+$ ions are exchanged with Na$^+$ ions. Accordingly, the surface of the glass can grow in the thickness direction as result of the A6 scenario after the d-IOX step 304, thus forming surface 302a.

Figure 4:
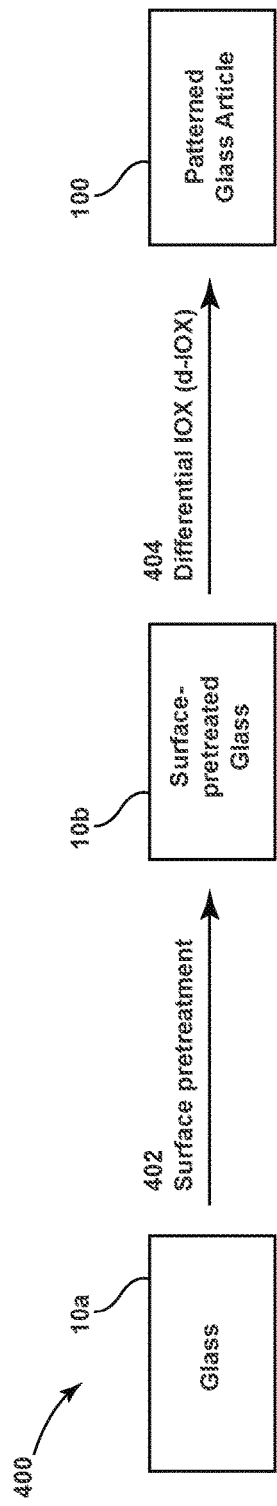
FIG. 4 is a schematic, flow chart depicting a differential ion exchange method of making a patterned article as depicted in FIGS. 1 and 1A, according to an aspect of the disclosure.

According to another embodiment, a method 400 of making a patterned article 100 (see FIGS. 1 & 1A) is outlined in exemplary form as follows and as depicted in FIG. 4. The method 400 includes a step of providing a glass substrate 10a comprising a thickness and a primary surface. Further, the glass substrate 10a has a bulk composition comprising silica and alkali metal ions. In some embodiments, and as noted earlier, the method 400 can include subjecting the glass substrate 10a to an ion exchange process, for example by immersing the glass substrate 10a in a first bath comprising ion-exchangeable, alkali metal ions to form an initial compressive stress region in the glass substrate 10a, the subjecting step conducted prior to or as part of the step of providing the glass substrate (not shown in FIG. 4). Accordingly, the glass substrate 10a of the 'providing' step can possess an initial compressive stress region, prior to the initiation of this step.

The method 400 of making a patterned article 100 (see FIGS. 1 and 1A) can also include a step 402 (labeled as "Surface pretreatment" in FIG. 4) of disposing a plurality of discrete masks comprising a multivalent metal salt on the primary surface of the glass substrate 10a to form a masked substrate 10b such that a portion of the primary surface is masked and a portion is not masked. The step of disposing the plurality of masks can comprise at least one of a spin coating, dip coating, and screen printing process step to form the plurality of masks comprising a multivalent metal salt on the primary surface of the glass substrate. Further, the method 400 includes a step 404 (labeled as "d-IOX" in FIG. 4) for subjecting the masked substrate 10b to an ion-exchange process, for example by immersing the masked substrate 10b in a bath comprising ion-exchangeable, alkali metal ions to form a compressive stress region and a patterned region in the masked substrate. Upon the completion of step 404 of the method 400, a patterned article 100 has been formed, comprising a patterned region and a compressive stress region (e.g., patterned region 90 and compressive stress region 50, as shown in FIGS. 1 & 1A). As noted earlier, the patterned region comprises a surface roughness ($R_a$) from about 1 nm to about 600 nm and at least one of a plurality of protrusions 94 and a plurality of depressions 96. Further, each of the compressive stress region and the patterned region comprises a plurality of ion-exchangeable, alkali metal ions. According to a further implementation of the method 400, the patterned region is defined by at least a portion of the primary surface of the glass substrate 10b and the compressive stress region extends from the at least a portion of the primary surface to a first selected depth within the substrate.

In some embodiments, the method 400 of making a patterned article further includes the optional step of removing the plurality of masks comprising a multivalent metal salt on the primary surface of the glass substrate, the optional removing step is conducted after step 404. The method 400 can also be conducted such that the multivalent metal salt is selected from the group consisting of calcium chloride, calcium nitrate, barium chloride, barium nitrate, magnesium chloride, magnesium nitrate, zinc chloride, zinc nitrate, strontium chloride and strontium nitrate. Further, the multivalent metal salt can be selected from the salts capable of providing at least one of sodium, potassium, rubidium, cesium, silver and copper (I) ions.

Figure 4A:
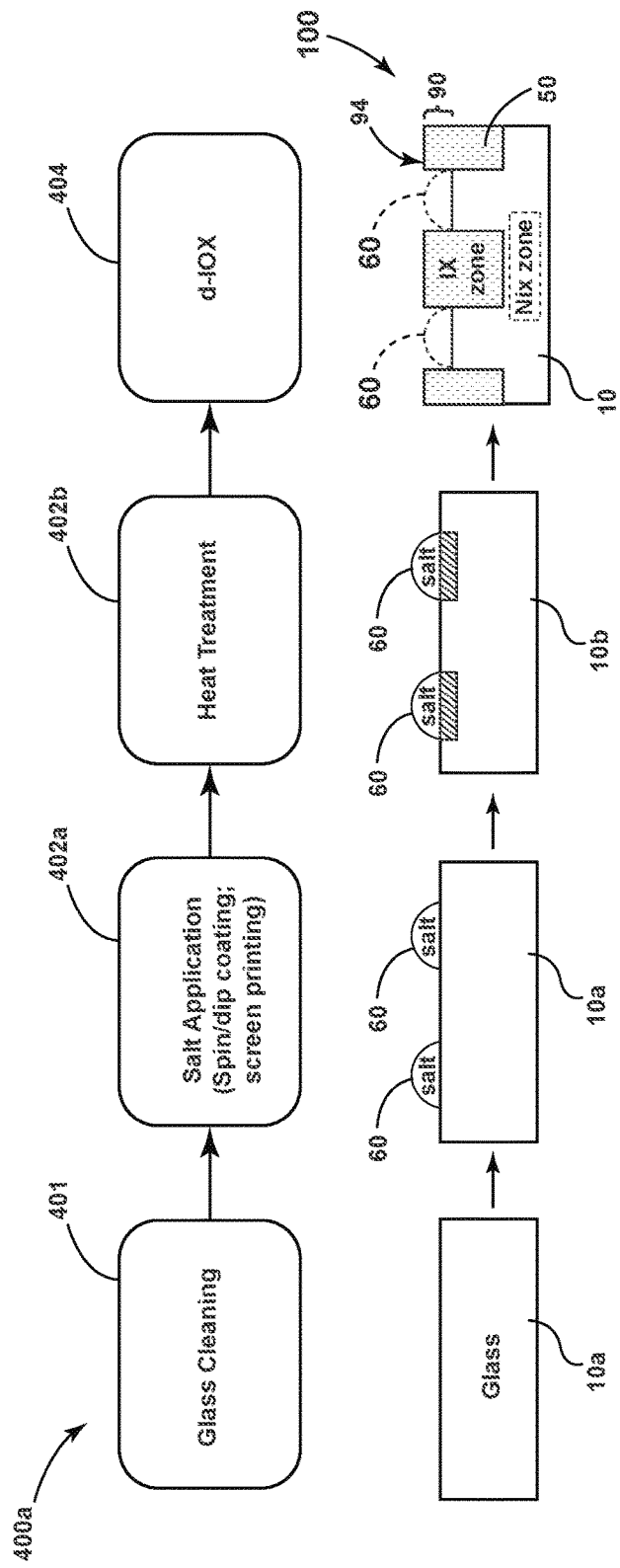
FIG. 4A is a schematic, flow chart depicting a differential ion exchange method of making a patterned article as depicted in FIGS. 1 and 1A, according to another aspect of the disclosure.

Referring now to FIG. 4A, an exemplary method 400a of making a patterned article 100 is depicted in schematic form. The method 400a is similar to and stands as exemplary of the method 400 outlined above and depicted in FIG. 4. In method 400a, a glass substrate 10a is subjected to a glass cleaning step 401. The glass cleaning step can comprise an immersion of the substrate 10a in a detergent wash (e.g., an immersion in an aqueous solution containing potassium hydroxide at a pH of 13 or higher at 60° C. for about 10 minutes). After completion of the cleaning step 401 in the method 400a, the glass substrate 10a is subjected to a metal salt application step 402a. In embodiments, the glass substrate 10a is immersed in an aqueous multivalent metal salt solution during the salt application step 402a. The multivalent metal salt can be selected from the group consisting of calcium chloride, calcium nitrate, barium chloride, barium nitrate, magnesium chloride, magnesium nitrate, zinc chloride, zinc nitrate, strontium chloride and strontium nitrate. Further, the multivalent metal salt can be selected from the salts capable of providing at least one of sodium, potassium, rubidium, cesium, silver and copper (I) ions. For example, step 402a can be conducted with a solution of about 500 ppm to about 20000 ppm of $CaCl_2$) in water or a 1:1 mixture of water and ethanol from ambient temperature to about 100° C. Further, the immersion of the salt application step 402a can be conducted with the immersion of the glass substrate 10a in the metal salt solution lasting from about 30 seconds to about 60 minutes.

After completion of the immersion of the salt application step 402a, the glass substrate 10a can be dried in air from ambient temperature to about 100° C. and a plurality of masks 60 comprising the multivalent metal salt is formed on one or more primary surfaces of the glass substrate 10a. Further, the composition of the multivalent salt, the concentration of the salt, immersion time and drying conditions during or after the step 402a can influence the size and distribution of the plurality of masks 60 on one or more of the primary surfaces of the glass substrate 10a. It should also be understood that the salt application step 402a can comprise at least one of a spin coating, dip coating, and screen printing process step to form the plurality of masks 60 comprising a multivalent metal salt on the primary surface of the glass substrate 10a.

Referring again to FIG. 4A, the method 400a of making a patterned article 100 continues and the glass substrate 10a with the plurality of masks 60 is subjected to a heat treatment step 402b. In step 402b, the plurality of the masks 60 are adhered to or otherwise diffused into the one or more primary surfaces of the glass substrate 10a. In an embodiment, the heat treatment step 402b is conducted such that the glass substrate 10a comprising the plurality of masks 60 is heated in air to a heat treatment temperature from about 200° C. to about 500° C., such as from about 225° C. to about 450° C., or from about 250° C. to about 400° C., for a duration of about 10 to 120 minutes. After completion of the heat treatment step 402b, a masked glass substrate 10b is formed with a plurality of masks 60 coupled to one or more of its primary surfaces. At this point in the method 400a, a differential ion-exchange (d-IOX) step 404 is conducted by immersing the glass substrate 10b in one or more ion exchange baths. An exemplary d-IOX step 404 can be conducted by immersing the glass substrate 10b in a molten salt bath at a temperature from about 375° C. to about 480° C. for about 1 to 10 hours, the bath having a composition of about 80 wt % $KNO_3$ and 20 wt % $NaNO_3$. The net effect of the step 404 is that ion exchange occurs between the plurality of masks 60, essentially consistent with scenarios A1 and A5 in FIG. 3. After the glass substrate is subjected to the desired molten salt bath immersions in step 404, the plurality of masks 60 can optionally be removed in a subsequent processing step with a detergent wash (e.g., an immersion in an aqueous solution containing potassium hydroxide at a pH of 13 or higher at 60° C. for about ten minutes). Upon removal of the plurality of masks 60 in the method 400a, a patterned article 100 has been formed with a patterned region 90 comprising a plurality of protrusions 94. The plurality of protrusions 94 corresponds to locations between the masks 60, where alkali metal ions residing in the glass substrate have been exchanged with larger ions from the molten salt bath. Further, the locations in proximity to the plurality of masks 60 have an essentially unchanged surface, akin to the A5 scenario (see FIG. 3), where alkali metal ions have not been exchanged from the molten salt bath. Further, a compressive stress region 50 has been formed in the glass substrate 10, as shown in FIG. 4A (also labeled as "IX zone"). As is also evident from FIG. 4A, the region beneath the compressive stress region 50 does not contain ion-exchanged ions and, accordingly, is labeled "Nix zone" to denote that there is no ion exchange in this region.

EXAMPLES

The following examples describe various features and advantages provided by the disclosure, and are in no way intended to limit the invention and appended claims.

Example 1

Samples of Glass 1 were treated according to the conditions set forth below in Table 1. Glass 1 had an approximate composition on an oxide basis of 63.60 mol % $SiO_2$; 15.67 mol % $Al_2O_3$; 10.81 mol % $Na_2O$; 6.24 mol % $Li_2O$; 1.16 mol % ZnO; 2.48 $P_2O_5$; and 0.04 mol % $SnO_2$. The samples were not ion exchanged prior to the treatments listed below in Table 1; however, all glass substrate samples were subjected to a detergent wash in a solution containing potassium hydroxide at a pH of 13 or higher at 60° C. for 10 minutes prior to immersion in the listed multivalent salt solution. Each sample had the following dimensions: 50 mm×50 mm×1 mm. All samples were dipped in the listed calcium chloride solution at 60° C. for 2 minutes. During the d-IOX process step, all glass samples were subjected to an immersion in a molten salt bath having a composition of 80 wt. % $KNO_3$ and 20 wt. % $NaNO_3$ at a temperature of about 380° C. for 6.25 hours. All glass substrate samples were then subjected to a detergent wash in a solution containing potassium hydroxide at a pH of 13 or higher at 60° C. for 10 minutes after completion of the d-IOX process step. Finally, all samples were characterized according to the methods outlined earlier in the disclosure for surface roughness ($R_a$), maximum valley depth ($R_{pv}$) and haze.

As is evident from Table 1, the Exs. 1-4 and 1-7 conditions produced patterned articles with a surface roughness ($R_a$) of greater than 5 nm and maximum valley depth ($R_{pv}$) of greater than 50 nm. Further, the Exs. 1-2, 1-4, 1-6 and 1-7 conditions produced patterned articles with a surface roughness ($R_a$) of greater than 1 nm and maximum valley depth ($R_{pv}$) of greater than 50 nm. From the results, it is evident that increasing the salt concentration to 10000 ppm and the heat treatment temperature to 400° C. tends to produce more highly patterned articles. Without being bound by any particular theory, it is believed that an increased heat treatment temperature tends to improve the bond of the islands to the primary surfaces of the glass to ensure an effective mask during the subsequent d-IOX process step, thus resulting in a patterned article with a more extensive patterned region. It is also evident from Table 1 that the haze levels for all samples are below 1%, indicative of a textured appearance with little haze.

Example 2

Figure 5:
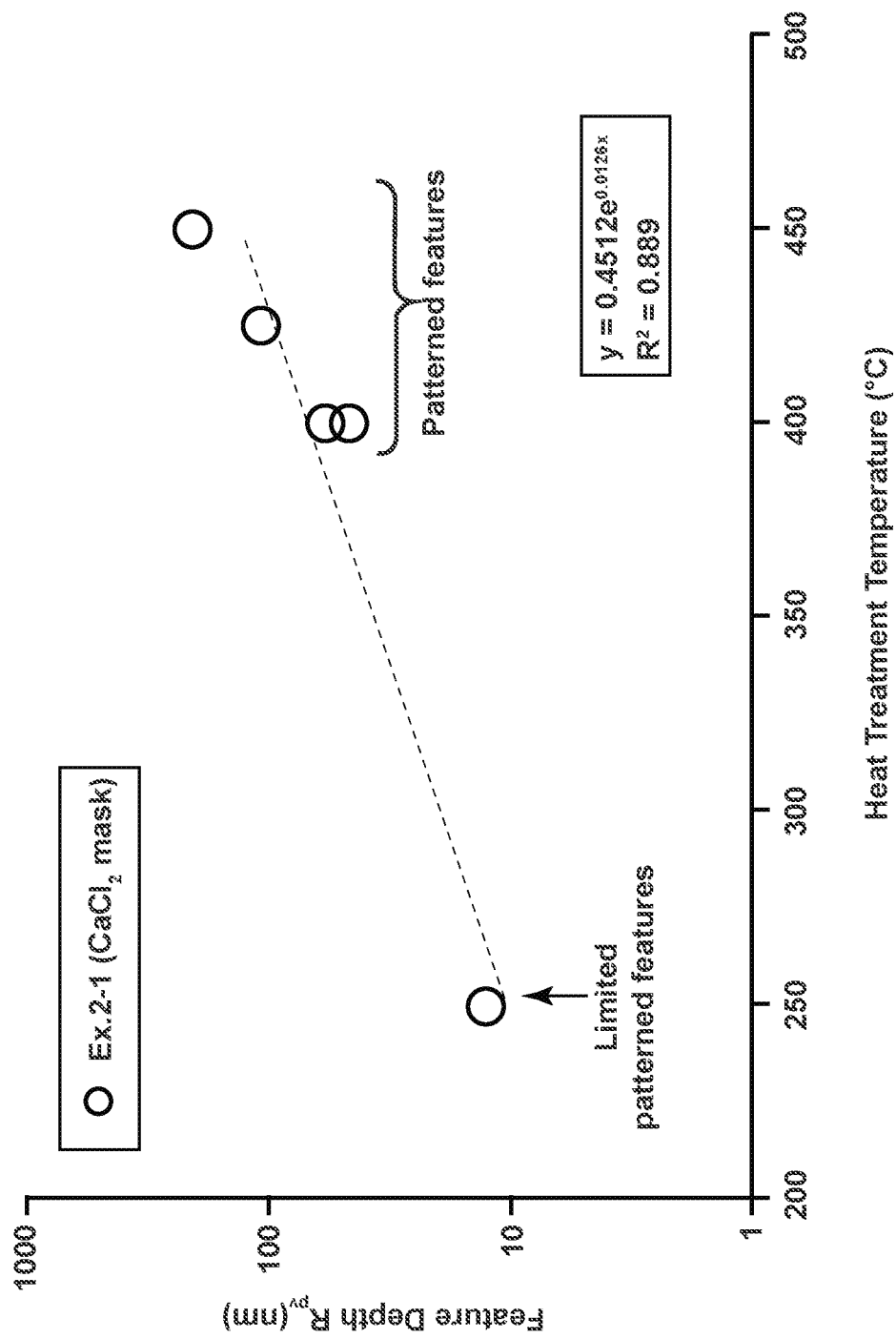
FIG. 5 is a plot of feature depth vs. pre-treatment temperature for patterned articles made with a differential ion exchange method, according to an aspect of the disclosure.

In this example, Glass 1 samples, as pre-cleaned with a detergent wash (i.e., as outlined earlier in the disclosure), were subjected to a dip coating with a $CaCl_2$) metal salt, followed by varying heat treatment conditions (at 250° C., 400° C., 425° C. and 450° C.) to form a plurality of discrete masks on the primary surfaces of each substrate. In particular, the dip coating was conducted in a solution of 1 wt. % $CaCl_2$) in 1:1 $H_2O$ and ethanol (by volume). Further, each substrate was subjected to the following d-IOX conditions: all glass samples were subjected to an immersion in a molten salt bath having a composition of 80 wt. % $KNO_3$ and 20 wt. % $NaNO_3$ at a temperature of about 380° C. for 6.25 hours, followed by a detergent wash. Finally, all samples were characterized according to the methods outlined earlier in the disclosure for maximum valley depth ($R_{pv}$). As shown in FIG. 5, the maximum valley depth vs. heat treatment temperature is plotted for these examples. It is evident from FIG. 5 that increasing the heat treatment temperature to at least about 400° C. tends to result in patterned articles with a more substantial patterned region having an $R_{pv}$ of at least 50 nm as compared to samples heat treated at 250° C.

Many variations and modifications may be made to the above-described embodiments of the disclosure without departing substantially from the spirit and various principles of the disclosure. All such modifications and variations are intended to be included herein within the scope of this disclosure and protected by the following claims.

TABLE 1

| | Dip coating conditions | | | | IOX | | Results | | |
|---|---|---|---|---|---|---|---|---|---|
| | | | solvent | Oven | | | Temp | | |
| Ex. | Salt | [salt], ppm | ($H_2O$: EtOH) | Temp (° C.) | Time (min) | $KNO_3$/ $NaNO_3$ | (° C.)/ time (hr) | $R_a$ (nm) | $R_{pv}$ (nm) | Haze (%) |
| 1-1 | $CaCl_2$ | 1000 | 100/0 | 250 | 60 | 80/20 | 380/6.25 | 0.738 | 9.25 | 0.03 |
| 1-2 | | 1000 | 100/0 | 400 | | | | 1.58 | 94.91 | 0.04 |
| 1-3 | | 10000 | 100/0 | 250 | | | | 0.726 | 12.52 | 0.04 |
| 1-4 | | 10000 | 100/0 | 400 | | | | 7.59 | 58.93 | 0.05 |
| 1-5 | | 1000 | 50/50 | 250 | | | | 0.742 | 21.43 | 0.04 |
| 1-6 | | 1000 | 50/50 | 400 | | | | 1.074 | 70.9 | 0.05 |
| 1-7 | | 10000 | 50/50 | 400 | | | | 18.32 | 77.37 | 0.11 |
| 1-8 | | 10000 | 50/50 | 250 | | | | 0.801 | 36.81 | 0 |

What is claimed is:

1. An article, comprising:
    an alkali silicate glass substrate comprising a thickness and a primary surface, the substrate having a bulk composition;
    a patterned region defined by at least a portion of the primary surface; and
    a compressive stress region that extends from the at least a portion of the primary surface to a first depth within the substrate,
    wherein the patterned region comprises a surface roughness ($R_a$) from about 1 nm to about 600 nm, a plurality of protrusions and a plurality of depressions,
    wherein the plurality of protrusions comprises a maximum protrusion compressive stress and the plurality of depressions comprises a maximum depression compressive stress, the maximum protrusion and depression compressive stresses differing from one another, and
    further wherein each of the compressive stress region and the patterned region comprises a concentration of at least one alkali metal ion that is different than the concentration of the at least one alkali metal ion in the bulk composition.

2. The article according to claim 1, wherein the patterned region comprises a surface roughness ($R_a$) from about 1 nanometer (nm) to about 100 nm.

3. The article according to claim 1, wherein the patterned region further comprises a maximum valley depth ($R_{pv}$) from about 10 nm to about 750 nm.

4. The article according to claim 1, wherein the patterned region further comprises a maximum valley depth ($R_{pv}$) from about 10 nm to about 250 nm.

5. The article according to claim 1, further comprising:
    a non-patterned region defined by a second portion of the primary surface, wherein the compressive stress region comprises a compressive stress that is greater in magnitude than any residual stress in the non-patterned region.

6. An article, comprising:
    an alkali silicate glass substrate comprising a thickness and a primary surface, the substrate having a bulk composition;
    a patterned region defined by at least a portion of the primary surface and comprising a plurality of protrusions and a plurality of depressions; and
    a compressive stress region that extends from the at least a portion of the primary surface to a first depth within the substrate,
    wherein the patterned region comprises a surface roughness ($R_a$) from about 1 nm to about 600 nm,
    wherein the plurality of protrusions comprises a maximum protrusion compressive stress and the plurality of depressions comprises a maximum depression compressive stress, the maximum protrusion and depression compressive stresses differing from one another, and
    further wherein the patterned region comprises a concentration of at least one alkali metal ion that is different than the concentration of the at least one alkali metal ion in the bulk composition.

7. The article according to claim 6, wherein the patterned region comprises a surface roughness ($R_a$) from about 1 nm to about 100 nm.

8. The article according to claim 6, wherein the patterned region further comprises a maximum valley depth ($R_{pv}$) from about 10 nm to about 750 nm.

9. The article according to claim 6, wherein the patterned region further comprises a maximum valley depth ($R_{pv}$) from about 10 nm to about 250 nm.

10. The article according to claim 6, wherein the compressive stress region and the patterned region are formed by an ion-exchange process.

11. An electronic device, comprising:
    a housing having a front surface, a back surface and side surfaces;
    electrical components provided at least partially within the housing, the electrical components including at least a controller, a memory, and display, the display being provided at or adjacent the front surface of the housing; and
    a cover substrate,
    wherein at least a portion of at least one of the cover substrate and the housing comprises the article of claim 1.

12. A method of making a patterned article, comprising:
    disposing a plurality of masks comprising a multivalent metal salt on a primary surface of an alkali silicate glass substrate to form a masked substrate; and
    subjecting the masked substrate to an ion exchange process to form a compressive stress region and a patterned region in the masked substrate,
    wherein the patterned region comprises a surface roughness ($R_a$) from about 1 nm to about 600 nm and at least one of a plurality of protrusions and a plurality of depressions, and
    further wherein the patterned region comprises a concentration of at least one alkali metal ion that is different than the concentration of the at least one alkali metal ion in a bulk composition of the substrate.

13. The method according to claim 12, further comprising:
    removing the plurality of masks comprising a multivalent metal salt on the primary surface of the alkali silicate glass substrate, the removing being conducted after subjecting the masked substrate to the ion exchange process.

14. The method according to claim 12, wherein the multivalent metal salt is selected from the group consisting of calcium chloride, calcium nitrate, barium chloride, barium nitrate, magnesium chloride, magnesium nitrate, zinc chloride, zinc nitrate, zinc sulfate, strontium chloride and strontium nitrate.

15. The method according to claim 12, wherein the multivalent metal salt is a salt capable of providing at least one of sodium, potassium, rubidium, cesium, silver and copper (I) ions.

16. The method according to claim 12, further comprising:
    subjecting the alkali silicate glass substrate to an ion exchange process to form an initial compressive stress region in the alkali silicate glass substrate prior to disposing the plurality of masks.

17. The method according to claim 12, wherein the patterned region is defined by at least a portion of the primary surface and the compressive stress region extends from the at least a portion of the primary surface to a first selected depth within the substrate.

18. An electronic device, comprising:
    a housing having a front surface, a back surface and side surfaces;
    electrical components provided at least partially within the housing, the electrical components including at least a controller, a memory, and display, the display being provided at or adjacent the front surface of the housing; and a cover substrate, wherein at least a portion of at least one of the cover substrate and the housing comprises the article of claim 6.

19. The article according to claim 1, wherein the compositions of the plurality of protrusions and the plurality of depressions differ from one another.

20. The article according to claim 6, wherein the compositions of the plurality of protrusions and the plurality of depressions differ from one another.

\* \* \* \* \*